(12) United States Patent
Iida et al.

(10) Patent No.: US 8,035,037 B2
(45) Date of Patent: Oct. 11, 2011

(54) CORE SUBSTRATE AND METHOD OF PRODUCING THE SAME

(75) Inventors: Kenji Iida, Kawasaki (JP); Tomoyuki Abe, Kawasaki (JP); Yasutomo Maehara, Kawasaki (JP); Shin Hirano, Kawasaki (JP); Takashi Nakagawa, Kawasaki (JP); Hideaki Yoshimura, Kawasaki (JP); Seigo Yamawaki, Kawasaki (JP); Norikazu Ozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 722 days.

(21) Appl. No.: 12/170,963

(22) Filed: Jul. 10, 2008

(65) Prior Publication Data

US 2009/0095524 A1    Apr. 16, 2009

(30) Foreign Application Priority Data

Oct. 12, 2007  (JP) ................................. 2007-267157

(51) Int. Cl.
*H05K 1/11* (2006.01)

(52) U.S. Cl. ........ 174/261; 174/250; 174/251; 174/262; 428/901

(58) Field of Classification Search ........................ None
See application file for complete search history.

(56) References Cited

U.S. PATENT DOCUMENTS

| 3,610,811 | A | * | 10/1971 | O'Keefe | 174/262 |
|---|---|---|---|---|---|
| 5,835,355 | A | * | 11/1998 | Dordi | 361/760 |
| 6,420,017 | B1 | * | 7/2002 | Matsuda et al. | 428/209 |
| 6,599,562 | B2 | * | 7/2003 | Matsuda et al. | 427/97.2 |
| 6,707,683 | B1 | * | 3/2004 | Bravek et al. | 361/777 |
| 6,954,987 | B2 | * | 10/2005 | Wong et al. | 29/852 |
| 7,304,389 | B2 | * | 12/2007 | Yoshimura | 257/774 |
| 7,378,326 | B2 | * | 5/2008 | Ahn et al. | 438/361 |

FOREIGN PATENT DOCUMENTS

| JP | 2004-87989 | 3/2004 |
|---|---|---|
| JP | 2005-136347 | 5/2005 |
| JP | 2006-222216 | 8/2006 |
| WO | 2004/064467 A1 | 7/2004 |

* cited by examiner

*Primary Examiner* — Boris Chervinsky
(74) *Attorney, Agent, or Firm* — Staas & Halsey LLP

(57) ABSTRACT

The core substrate is capable of securely preventing short circuit between an electrically conductive core section and a plated through-hole section. The core substrate comprises: an electrically conductive core section having a pilot hole, through which a plated through-hole section is formed; electrically conductive layers coating the inner face of the pilot hole and a surface of the core section; a gas purging hole being formed in the conductive layer coating the surface of the core section; an insulating material filling a space between the inner face of the pilot hole and an outer circumferential face of the plated through-hole section; and cable layers being laminated on both side faces of the core section.

10 Claims, 7 Drawing Sheets

CORE SUBSTRATE AND METHOD OF PRODUCING THE SAME

BACKGROUND OF THE INVENTION

The present invention relates to a core substrate having an electrically conductive core section, a method of producing the core substrate and a method of producing a circuit board having the core substrate, more precisely relates to a core substrate capable of solving a problem of expansion of cable layers on the substrate, which is caused by a gas generated from the substrate when a thermal treatment is performed, a method of producing the core substrate and a method of producing a circuit board having the core substrate.

Some test substrates, which are used for testing circuit boards, on which semiconductor elements will be mounted, and semiconductor wafers, include core substrates composed of carbon fiber-reinforced plastic (CFRP). In comparison with conventional glass-epoxy core substrates, thermal expansion coefficients of the core substrates composed of carbon fiber-reinforced plastic are small, and thermal expansion coefficients of the circuit boards having such core substrates can be corresponded to those of semiconductor elements to be mounted on the circuit boards. Therefore, thermal stress generated between a semiconductor element and a circuit board can be effectively avoided.

The circuit board is formed by laminating cable layers on the both side faces of the core substrate, and plated through-hole (PTH) sections are formed in the core substrate so as to mutually electrically connect the cable layers on the both side faces thereof. The plated through-hole sections are formed by boring through-holes in a substrate and forming plated layers (electrically conductive parts) on inner faces of the through-holes.

In case of the core substrate having the electrically conductive core section composed of, for example, carbon fiber-reinforced plastic, if the plated through-hole sections are formed by merely boring the through-holes and plating the inner faces thereof, the plated through-hole sections and the core section are electrically shorted. Thus, the plated through-hole sections are formed in the core substrate having the electrically conductive core section by the steps of: forming pilot holes, whose diameters are greater than those of the plated through-hole sections to be formed, in the core substrate; filling the pilot holes with insulating resin; and forming the plated through-hole sections in the filled through-holes. With this method, the plated through-hole sections and the core section are not electrically shorted (see JP Kohyo Gazette No. 2004/064467, JP Patent Gazette No. 2006-222216).

However, if the pilot holes are drilled, burrs are formed on inner faces of the pilot holes and the plated through-hole sections and the core section will be electrically shorted. To solve this problem, the inner faces of the pilot holes are coated with insulating layers so as not to electrically short the plated through-holes and the core section (see JP Patent Gazette No. 2006-222216). However, it is difficult to perfectly coat the rough inner faces of the pilot holes.

In a production process of a circuit board, prepregs and cable sheets are piled, heated and pressurized so as to integrally laminate them, so that the cable layers can be laminated. In this case, there are a disadvantage of generating a decomposition gas from an insulating material and vaporizing moisture absorbed in a substrate while performing the heating step. Thus, some means for discharging gasses from inner layers of the substrate have been employed (see JP Patent Gazettes No. 2004-87989 and No. 2005-136347).

In case of the core substrate having pilot holes for forming the plated through-hole sections, the gasses, which are generated in the substrate while producing the substrate, will cause the problem of short circuit between the core section and the plated through-hole sections. This short circuit must be prevented.

SUMMARY OF THE INVENTION

The present invention was conceived to solve the above described problems.

An object of the present invention is to provide a core substrate, which is capable of securely preventing short circuit between an electrically conductive core section and a plated-through hole section.

Another object is to provide a method of producing the core substrate.

Further object is to provide a method of producing a circuit board having the core substrate.

To achieve the objects, the present invention has following constitutions.

Namely, the core substrate of the present invention comprises: an electrically conductive core section having a pilot hole, through which a plated through-hole section is formed; electrically conductive layers coating the inner face of the pilot hole and a surface of the core section; a gas purging hole being formed in the conductive layer coating the surface of the core section; an insulating material filling a space between the inner face of the pilot hole and an outer circumferential face of the plated through-hole section; and cable layers being laminated on both side faces of the core section.

In the core substrate, copper foils may be bonded on the both side faces of the core section with insulating layers, the pilot hole may be formed to penetrate into the substrate, on which the copper foils have been bonded, the conductive layers may coat the inner face of the pilot hole and the copper foils coating the surfaces of the substrate, and the gas purging hole may be formed in the copper foil on the surfaces of the substrate and the conductive layer.

The core substrate may further comprise an insulating film being formed on the conductive layer coating the inner face of the pilot hole. With this structure, short circuit between the conductive core section and the plated through-hole section can be securely prevented.

In the core substrate, the gas purging hole may be located near an edge of the pilot hole. With this structure, a gas, which is generated from the substrate, or water vapor, which is generated by vaporizing moisture absorbed in the substrate, can be efficiently discharged, so that expansion of the plated layer on the inner face of the pilot hole can be prevented.

In the core substrate, the core section may be composed of carbon fiber-reinforced plastic and formed into a flat plate by heating and pressurizing a plurality of prepregs including carbon fibers. With this structure, thermal expansion coefficient of the core substrate can be corresponded to that of a semiconductor element to be mounted, so that the highly reliable core substrate can be provided.

The method of producing the core substrate of the present invention comprises the steps of: forming a pilot hole in a substrate having an electrically conductive core section; so as to form a plated layer coating an inner face of the pilot hole and a surface of the substrate; forming a gas purging hole by etching an electrically conductive layer, which is formed on the plated layer coating the surface of the substrate; and filling the pilot hole of the substrate, in which the gas purging hole has been formed, with an insulating material. By etching the electrically conductive layer, which is formed on the plated layer coating the surface of the substrate, so as to form the gas purging hole, expanding the plated layer coating the inner face of the pilot hole can be prevented while filling the pilot hole with resin (the insulating material) and heating to cure the resin.

In the method, an insulating film may be formed on the plated layer by an electrodeposition method, in which the plated layer is used as an electric power feeding layer, after forming the plated layer coating the inner face of the pilot hole and the surface of the substrate. With this method, the short circuit between the conductive core section and the plated through-hole section can be further securely prevented.

In the method, the conductive layers, which are formed on the surface of the substrate, may be formed in a prescribed pattern after filling the pilot hole with resin. With this method, the core substrate integrated with the cable layers can be produced after forming the cable layers in optional patterns.

In the method, cable layers may be integrally formed on the both side faces of the substrate after filling the pilot hole with resin, and a plated through-hole section may be formed, after forming the cable layers, by forming a through-hole in the pilot hole of the substrate and forming a plated layer on an inner face of the through-hole.

Further the method of producing a circuit board comprises the steps of: forming the core substrate of the present invention; and laminating cable layers on the core substrate.

In the present invention, the inner face of the pilot hole, through which the plated through-hole section is pierced, is coated with the plated layer, so that the short circuit between the plated through-hole section and the core section can be prevented. By forming the gas purging hole in the substrate, even if a gas is generated from the substrate by heat or water vapor is generated therefrom by vaporization while filling the pilot hole with resin or performing a heat treatment, the gas or the water vapor can be efficiently discharged or purged through the gas purging hole. Therefore, the expansion of the plated layer on the inner face of the pilot hole can be prevented, so that the short circuit between the plated through-hole section and the core section can be securely prevented.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with reference to the accompanying drawings.

(Steps of Forming Gas Purging Holes)

In the following description, methods of producing core substrates, each of which has an electrically conductive core section composed of carbon fiber-reinforced plastic, will be explained as embodiments of the present invention.

FIGS. 1A-2B show the steps of: forming pilot holes, through which plated through-hole sections will be respectively pierced, in a substrate; forming gas purging holes; and filling the pilot holes with insulating materials.

Figure 1A:
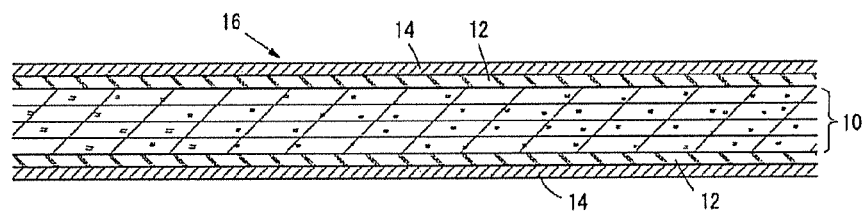
FIGS. 1A-1D are partial sectional views showing the steps of forming gas purging holes.

FIG. 1A shows a flat plate-shaped substrate 16, which comprises a core section 10 composed of carbon fiber-reinforced plastic and copper foils 14 respectively bonded on the both side faces of the core section 10 with prepregs 12. The core section 10 is formed by the steps of: laminating four prepregs, each of which is formed by impregnating a carbon cloth with polymer, e.g., epoxy resin; and heating and pressurizing the laminated prepregs so as to integrate them. Note that, number of the laminated prepregs including carbon fibers, which constitute the core section 10, can be optionally selected.

In the present embodiment, the core section 10 is constituted by woven carbon fiber cloths, each of which is composed of carbon fiber filaments. Further, unwoven carbon fiber cloths, carbon fiber meshes, etc. may be used instead of the woven carbon fiber cloth. Thermal expansion coefficients of carbon fibers are about 0 ppm/° C., and a thermal expansion coefficient of the core section 10 can be adjusted by selecting: a rate of content of carbon fibers in the carbon fiber-reinforced plastic; resin materials included in the carbon fibers; fillers mixed with the resin, etc. In the present embodiment, the thermal expansion coefficients of the core section 10 is about 1 ppm/° C.

A thermal expansion coefficient of the entire core substrate having the core section 10 composed of the carbon fiber-reinforced plastic can be adjusted by selecting thermal expansion coefficients of cable layers, which constitute the core substrate, and insulating layers, which are provided between the cable layers. Further, a thermal expansion coefficient of a circuit board, which is formed by laminating build-up layers on the both side faces of the core substrate, can be properly adjusted by selecting thermal expansion coefficients of the core substrate and the build-up layers. Thermal expansion coefficients of semiconductor elements are about 3.5 ppm/° C. Thermal expansion coefficients of the circuit board can be easily corresponded to that of semiconductor elements to be mounted on the circuit board.

Figure 1B:
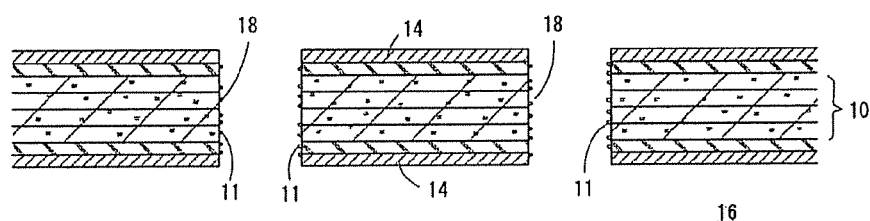
Figure 1C:
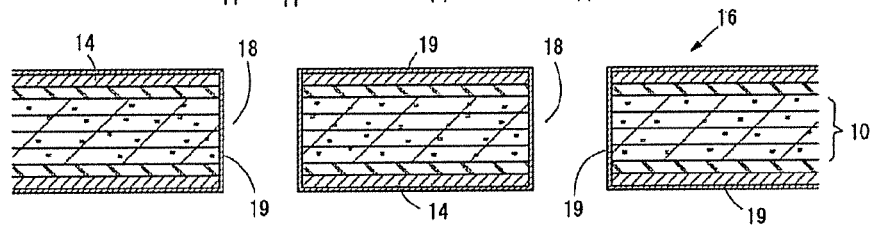

In FIG. 1B, pilot holes 18 are bored in the substrate 16. The pilot holes 18 are through-holes, which are bored in the thickness direction of the substrate 16 by a drill. Diameters of the pilot holes are greater than those of through-holes of plated through-hole sections, which will be formed in the following step. In the present embodiment, the diameters of the pilot holes 18 are 0.8 mm; the diameters of the through-holes of the plated through-hole sections are 0.35 mm. The pilot holes 18 are located at prescribed planar positions, which correspond to the plated through-hole sections to be formed in the core substrate.

When the pilot holes 18 are drilled, burrs are formed on inner faces of the pilot holes 18 due to, for example, abrasion of the drill, and the pilot holes 18 have rough or uneven inner faces. Further, drill dusts of the core section 10 will stick on the inner faces of the pilot holes 18.

In case of the core section 10 composed of carbon fiber-reinforced plastic, carbon dusts 11 stick on the inner faces of the pilot holes 18. The carbon dusts 11 have electric conductivity, so if the carbon dusts 11 invade into resin 20 filling the pilot holes 18, the insulation performance of the resin 20 is worsened. Further, the plated through-hole section and the core section 10 will be electrically shorted.

To prevent the short circuit between the plated through-hole sections and the core section 10, in the present embodiment, electroless copper plating and electrolytic copper plating are performed in this order after forming the pilot holes 18 in the substrate 16 so as to coat the inner faces of the pilot holes 18 with copper plated layers 19. By electroless-plating the substrate 16 with copper, the copper layer is formed on the entire inner faces of the pilot holes 18 and the entire side faces of the substrate 16. Then, the electrolytic plating is performed with using the copper layer as an electric power feeding layer, so that the plated layers 19 can be formed on the inner faces of the pilot holes 18 and the both side faces of the substrate 16 (see FIG. 1C). A thickness of the copper layer formed by the electroless plating is about 0.5 μm; thicknesses of the plated layers 19 formed by the electrolytic plating are about 10-20 μm.

By coating the inner faces of the pilot holes 18, the inner faces of the pilot holes 18 are made smooth, so that the pilot holes 18 can be easily filled with the resin 20 without forming voids. Therefore, the plated through-hole sections 20 and the core section 10 are not shorted at positions corresponding to voids. Further, the dusts 11 stuck on the inner faces of the pilot holes 18 are encompassed by or embedded in the plated layers 19, so that no dusts 11 are peeled from the inner faces thereof. With this structure, insulating performance of the resin 20 can be secured.

In the step of filling the pilot holes 18 with the resin 20, a heat treatment is performed so as to cure the resin 20, so a decomposition gas is generated from a plastic component of the core section 10 or moisture absorbed in the core section 10 is vaporized.

The decomposition gas and the water vapor, which are generated during the heat-curing step, move to exit from the core section 10, but the plated layers 19 coat the entire surfaces of the core section including the inner faces of the pilot holes 18. With this structure, the gas and the water vapor cannot exit therefrom, thus they expand the plated layers 19 coating the inner faces of the pilot holes and the copper foils 14 and the plated layers 19 coating the side faces of the substrate 16. A purpose of forming the plated layer 19 is to coat the inner faces of the pilot holes 18 and make them smooth. If the plated layers 19 are expanded, the purpose cannot be achieved.

The structure of entirely coating the surfaces of the substrate 18 including the inner faces of the pilot holes 18 with the plated layers 19 and the copper foils 14 causes the above described problem when the step of heat-curing the resin 20 in the pilot holes 18 is performed. Further, the structure causes the same problem when cable layers are formed on the both side faces of the substrate 16 by heating and pressurizing cable sheets with prepregs.

After forming the core substrate, a circuit board is produced by forming build-up layers on the both side faces of the substrate 16. The process of forming the build-up layers includes heating steps. In the method of producing the circuit board, some heating steps are performed when the cable layers are laminated with insulating layers. Therefore, it is important to discharge the gas and the water vapor, which are generated from the core section 10 and inner layers of the substrate 16 while performing the heating steps.

Thus, the present embodiment is characterized in that the decomposition gas from the core section 10 and the water vapor generated from the substrate are securely discharged via gas purging holes 140 formed in the surfaces of the substrate 16.

Figure 1D:
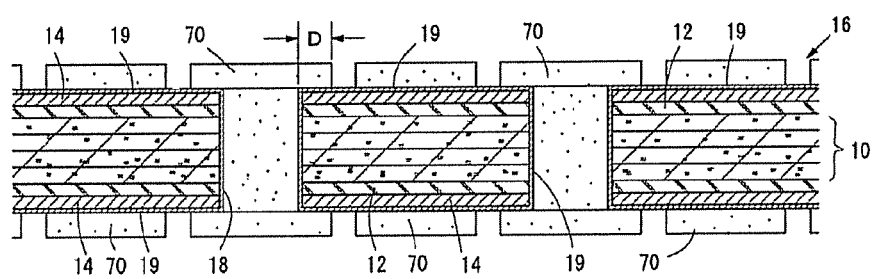

In FIG. 1D, dry film resist (photo resist) is applied on the both side faces of the substrate 16, and then the photo resist is patterned to form resist patterns 70, in which parts corresponding to the gas purging holes 140 to be formed are exposed, by optically exposing and developing the photo resist, so as to form the gas purging holes 140 in the both side faces of the resist 16.

By forming the gas purging holes 140, the copper foils 14 coating the side faces of the substrate 16 and the plated layers 19 laminating on the copper foils 14 are partially bored, so that the surfaces of the prepregs 12 coating the core section 10 are exposed so as to communicate the core section 10 to the outside.

Positions and sizes of the gas purging holes 14 may be optionally selected. In the present embodiment, the gas purging holes 140 are located near the pilot holes 18 so as to prevent expansion of the plated layers 19 on the inner faces of the pilot holes 18. Note that, in case of forming the gas purging holes 140 near the pilot holes 18, side faces of the gas purging holes 140 are etched by an invaded etching solution when the plated layers 19 and the copper foils 14 are etched with using the resist patterns 70 as masks. Thus, the gas purging holes 140 are respectively separated from edges of the pilot holes 18 with considering the amount of etching the side faces of the gas purging holes 140.

In the present embodiment, a symbol D stands for the separation between the pilot hole 18 and each of the gas purging holes 140.

In the present embodiment, the separation D between the gas purging hole 10 and the edge of the pilot hole 18 is 300-350 μm. When the gas purging holes 140 are formed, the amount of etching the side face of the gas purging holes 140 depends on thicknesses of the plated layers 19 and the copper foils 14, etching conditions, e.g., etching solution, etc. Therefore, the separation D may be designed on the basis of those conditions.

Figure 2A:
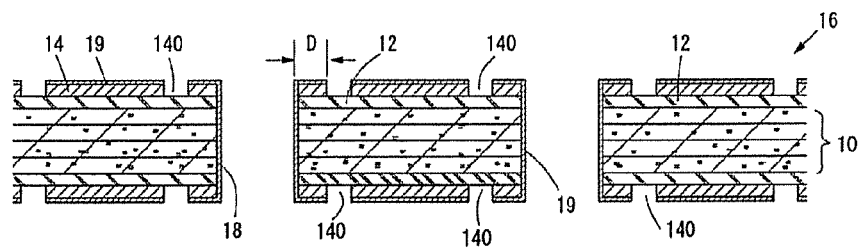
FIGS. 2A and 2B are partial sectional views showing the steps of forming the gas purging holes and filling pilot holes with resin.

In FIG. 2A, the gas purging holes 140 are formed by etching the plated layers 19 and the copper foils 14 with using the resist patterns 70 as masks. The surfaces of the prepregs 12 are exposed in the gas purging holes 140, and the core section 10 is communicated to the outside of the substrate 16 via the gas purging holes 140 so that the core section 10 is communicated to the outside. As described above, the distances between the gas purging holes 140 and the edges of the pilot holes are D.

Figure 3:
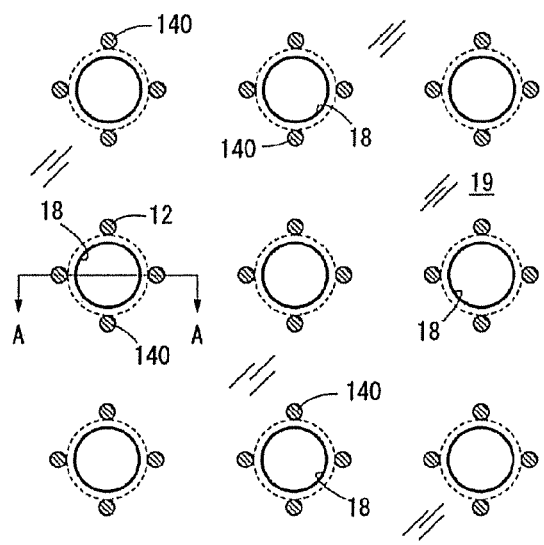
FIG. 3 is a plan view showing an arrangement of the pilot holes and the gas purging holes.

FIG. 3 is a partial plan view of the substrate 16, in which the gas purging holes 140 are formed in the surface of the substrate 16. The pilot holes 18 penetrating the substrate 16 are regularly arranged in a matrix form. Further, four gas purging holes 140 are cruciately arranged around the edge of each of the pilot holes 18. The surfaces of the prepregs 12 are exposed in the gas purging holes 140 as inner bottom faces thereof. The surfaces of the substrate 16 are the plated layers 19. Note that, FIG. 2A is a sectional view taken along a line A-A shown in FIG. 3.

The arrangement of the pilot holes 18 bored in the substrate 16 is not limited to the matrix form, so they may be arranged optionally. A plurality of the gas purging holes 140 may be provided between the adjacent pilot holes 18, may be radially arranged with respect to each of the pilot holes 18 and may be merely regularly arranged in the surface of the substrate 16.

As described above, the gas purging holes 140 are located near the edges of the pilot holes 18 so as to effectively purge the gas and/or water vapor from the parts near the pilot holes 18. If a large number of the gas purging holes 140 are further formed in the surfaces of the substrate 16 other than the parts near the pilot holes 18, the gas and/or water vapor can be easily purged from the core section 10. Further, many asperities, i.e., gas purging holes, are formed in the surfaces of the substrate 16, so that bonding strength between the substrate 16 and insulating layers, which are formed on the surfaces of the substrate 16, can be increased.

Figure 2B:
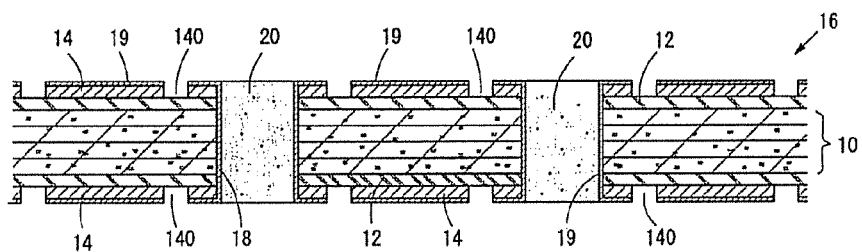

In FIG. 2B, the resin 20 is filled in the pilot holes 18 as insulating materials. The pilot holes 18 can be filled with the resin 20 by screen-printing or using a metal mask. After filling the pilot holes 18 with the resin 20, the resin 20 is cured by the heating step. In the present embodiment, the resin 20 is thermosetting epoxy resin, and the resin 20 is cured at temperature of about 160° C. Since the gas purging holes 140 are formed in the surfaces of the substrate 16, the decomposition gas and/or water vapor generated from the core section 10 can be discharged or purged to the outside via the gas purging holes 140, so that expansion of the plated layers 19 and the copper foils 14 can be prevented.

Note that, after heat-curing the resin 20 in the pilot holes 18, ends of the cured resin 20, which are projected outward from the pilot holes 18, are abraded and flattened, so that end faces of the cured resin 20 are made level with the surfaces of the plated layers 19.

Figure 4A:
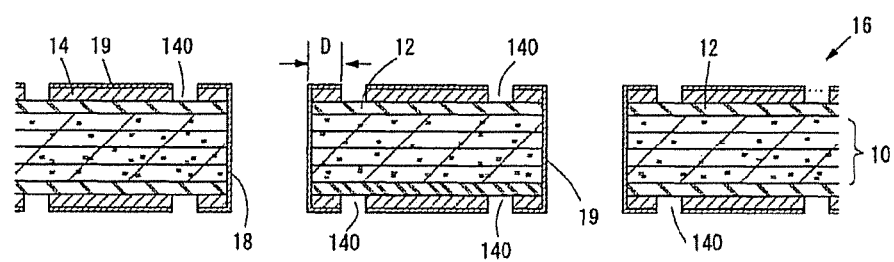
FIGS. 4A-4C are partial sectional views showing another process of producing the gas purging holes.
Figure 4B:
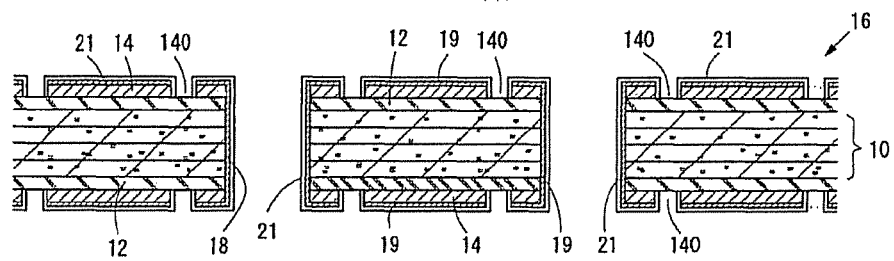

In FIGS. 4A-4B, the inner faces of the pilot holes 18 are coated with the plated layers 19, and then the inner faces of the pilot holes 18 are further coated with insulating films 21.

In FIG. 4A, the pilot holes 18 shown in FIG. 2A are coated with the plated layers 19.

In FIG. 4B, the insulating films 21 are formed on the copper foils 14 and the plated layers 18, which have been formed on the inner faces of the pilot holes 18 and the surfaces of the substrate 16, by the electrodeposition method. The plated layers 19 entirely coat the inner faces of the pilot holes 18 and the both side faces of the substrate 16. Therefore, the insulating films 21 can be formed on the inner faces of the pilot holes 18 and the entire side faces of the substrate 16 by the electrodeposition method, in which the plated layers 19 are used as electric power feeding layers. For example, the insulating films 21 can be electrodeposited by a constant current method, in which the substrate is soaked in an electrodeposition solution of epoxy resin and then a direct current is passed through the plated layers 19.

The insulating films 21 are formed to securely prevent short circuit between the pilot holes 18 and the plated through-hole sections.

After electrodepositing the insulating films 21 on the inner faces of the pilot holes 18 and the both side faces of the substrate 16, a drying process and a heating process are performed so as to cure the insulating films 21. Thicknesses of the insulating films 21 are 10-20 μm.

In the heating process for forming the insulating films 21, the gas generated from the core section 10 is discharged or purged to the outside via the gas purging holes 140, so that the inner faces of the pilot holes 18 can be coated with the insulating films 21 without causing the problem of expanding the copper foils 14 and the insulating films 21.

Figure 4C:
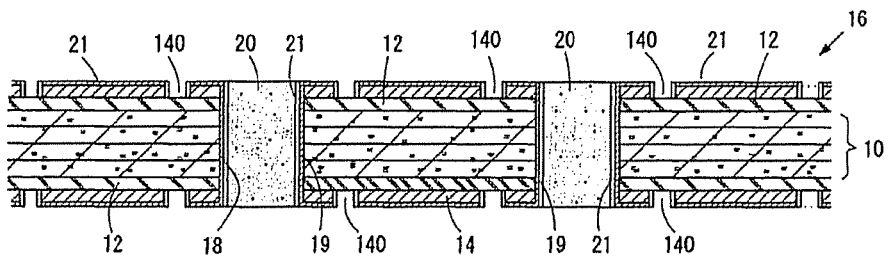

In FIG. 4C, the pilot holes 18, whose inner faces have been coated with the insulating films 21, are filled with the resin 20 as the insulating materials.

While heat-curing the resin 20 in the pilot holes 18, the gas generated from the core section and water vapor generated from the substrate 16 are discharged to the outside via the gas purging holes 140 formed in the surfaces of the substrate 16, so that the problem of expanding the plated layers 19 and the insulating films 21 can be prevented.

After heat-curing the resin 20 in the pilot holes 18, ends of the cured resin 20, which are projected outward from the pilot holes 18, are abraded and flattened. At that time, the insulating films 21 coating the surfaces of the substrate 16 are also abraded and removed.

By plating the inner faces of the pilot holes 18 with the plated layers 19, the rough inner faces of the pilot holes 18 can be made smooth, so that no voids are formed in the resin 20 when the pilot holes 18 are filled with the molten resin 20. Therefore, the short circuit between the core section and the plated through-hole sections, which is caused by voids formed in the resin 20, can be effectively prevented. By coating the plated layers 19 with the insulating films 21, the inner faces of the pilot holes 18 are made further smooth, filling rate of the resin 20 can be improved, and the insulating films 21 insulate the pilot holes 18 from the plated through-hole sections so that the short circuit between the core section 10 and the plated thorough-hole sections can be securely prevented.

(Steps of Producing Core Substrate)

The core substrate is formed by laminating cable layers on the both side faces of the substrate 16.

Figure 5A:
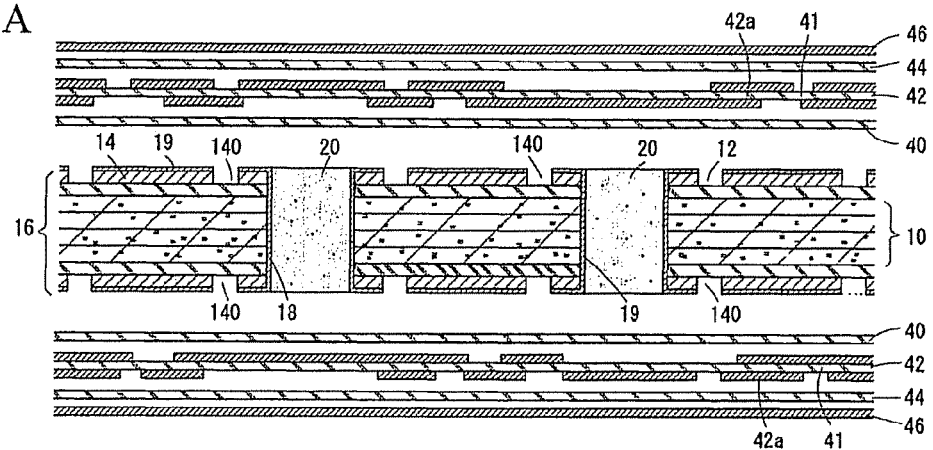
FIGS. 5A-5C are partial sectional views showing the steps of producing another core substrate.
Figure 5B:
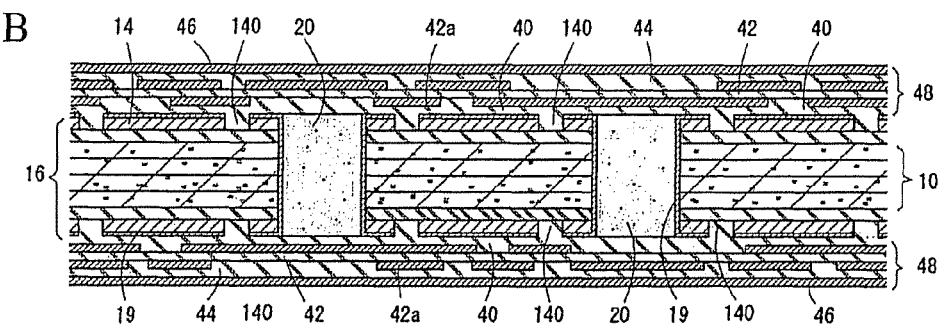
Figure 5C:
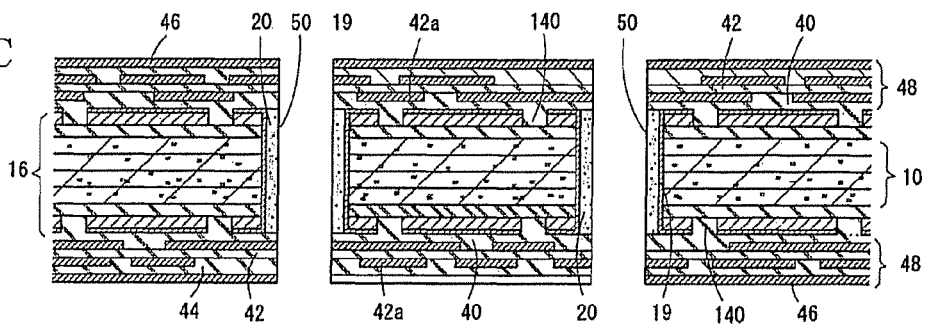

FIGS. 5A-5C show the steps of producing the core substrate, in which cable layers are formed on the both side faces of the substrate 16 shown in FIG. 2B, which has the pilot holes 18 coated with the plated layers 19.

In FIG. 5A, prepregs 40, cable sheets 42, prepregs 44 and copper foils 46 are laminated in this order. Each of the cable sheets 42 is constituted by an insulating resin sheet 41 and cable patterns 42a, which are formed on the both faces of the insulating resin sheet 41. The cable sheet 42 may be formed by etching copper foil layers of a copper-bonded substrate, which is constituted by an insulating resin sheet composed of a glass cloth and copper foils bonded on the both faces of the insulating resin sheet, in prescribed patterns.

In FIG. 5B, the prepregs 40, the cable sheets 42, the prepregs 44 and the copper foils 46, which have been correctly positioned on the both side faces of the substrate 16, are heated and pressurized, so that the prepregs 40 and 44 are cured and cable layers 48 are integrally laminated on the substrate 16. The prepregs 40 and 44 are formed by impregnating glass cloths with resin, and the uncured prepregs 40 and 44 are provided between layers. By the heating and pressurizing process, the prepregs 40 and 44 insulate and integrate the cable layers 48. Since the gas purging holes 140 are formed in the both side faces of the substrate 16, the gas purging holes 140 act as asperities on the surfaces of the substrate 16. Therefore, the gas purging holes 140 act as anchors, so that the cable layers 48 can be tightly bonded on the substrate 16.

In the step of bonding the cable layers 48 by heat-curing the prepregs 40 and 44 too, the gas and water vapor generated from the core section 10 and the substrate 16 can be discharged via the gas purging holes 140. The gas discharged from the gas purging holes 140 to the cable layers 48 is introduced to the outside via the laminated insulating layers.

In FIG. 5C, through-holes 50 are bored in the substrate 16, on which the cable layers 48 have been laminated, so as to form the plated through-hole sections. The through-holes 50 are coaxial with the pilot holes 18 and bored, by a drill, in the thickness direction of the substrate 16, which has been integrated with the cable layers 48. Since diameters of the through-holes 50 are smaller than those of the pilot holes 18, the resin 20 is exposed in the inner faces of the through-holes 50 passing through the resin 20.

Figure 6A:
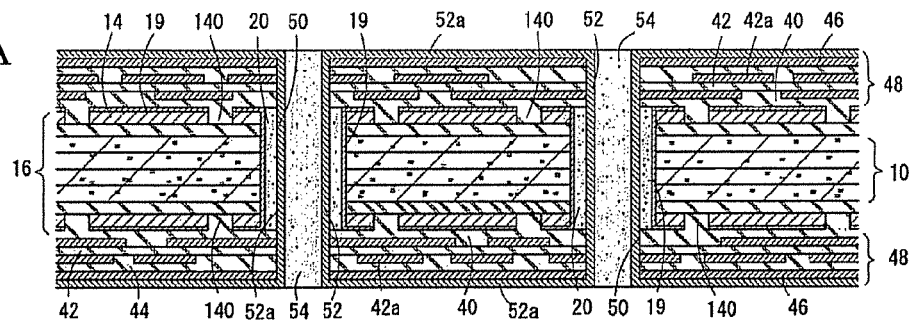
FIGS. 6A and 6B are partial sectional views showing further steps of producing another core substrate.

In FIG. 6A, the substrate 16 is plated with copper by an electroless plating method and an electrolytic plating method so as to form the plated through-hole sections 52 on the inner faces of the through-holes 50 after forming the through-holes 50. By performing the electroless plating method, the inner faces of the through-holes 50 and the entire surfaces of the substrate 16 are coated with copper. Then, the electrolytic plating method is performed with using the copper layer formed by the electroless plating method as electric power feeding layers, so that the inner faces of the through-holes 50 and the entire surfaces of the substrate 16 are coated with plated layers 52a. The plated layers 52a formed on the inner faces of the through-holes 50 acts as the plated through-hole sections 52, which mutually connect cable patterns formed on the both side faces of the substrate 16.

In the step shown in FIG. 6A, the through-holes 50 are filled with resin 54, and the resin 54 is heat-cured. In this heat-curing step too, the gas and water vapor generated from the core section 10, etc. can be discharged to the outside of the substrate via the gas purging holes 140, so that the problem of expanding the copper foils 14 and the plated layers 19 can be solved.

Figure 6B:
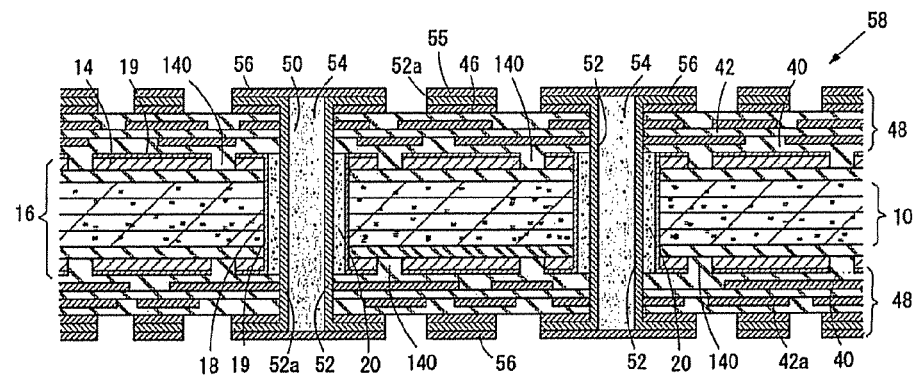

In FIG. 6B, plated layers 55, which are formed on the both side faces of the substrate 16 and each of which is constituted by the copper foil 46, the plated layer 52a and a cap-plated layer, are etched in prescribed patterns so as to form cable patterns 56 on the both side faces of the substrate 16. By forming the cable patterns 56, the core substrate 58 is completed.

The cable patterns 56 formed on the both side faces of the core substrate 58 are mutually electrically connected by the plated through-hole sections 52. Further, the inner cable patterns 42a in the cable layers 48 are connected to the plated through-hole sections 52 at suitable positions.

The core substrate 58 is characterized by: the gas purging holes 140 formed in the copper foils 14 and the plated layers 19, which are provided on the both side faces of the substrate 16 including the core section 10; the plated layers 19 coating the inner faces of the pilot holes 18 bored in the substrate 16; and the means for insulating the core section 10 from the plated through-hole sections 52.

Figure 7:
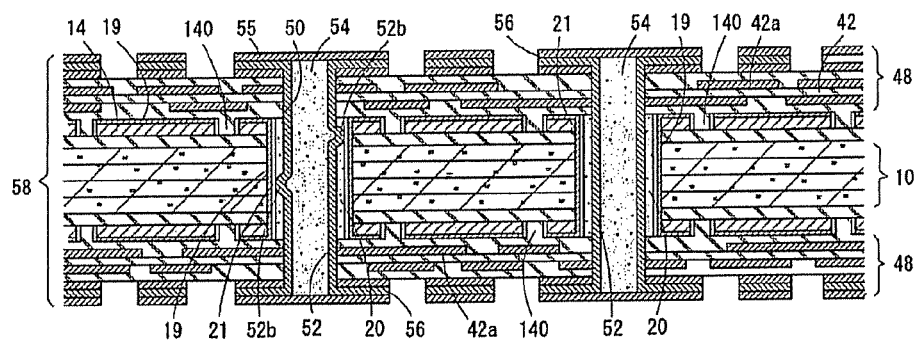
FIG. 7 is a partial sectional view of a modified core substrate.

FIG. 7 shows the core substrate 58 including the substrate 16 shown in FIG. 4C, in which the inner faces of the pilot holes 18 are coated with the plated layers 19 and insulating films 21.

In this case too, the core substrate 58 can be produced by laminating the cable layers 48 on the both side faces of the substrate 16 as well as the process shown in FIGS. 5A-6B. The cable patterns 56 are formed on the both side faces of the core substrate 58, and the cable patterns 56 are mutually electrically connected by the plated through-hole sections 52. Further, the gas purging holes 140 are bored in the copper foils 14 and the plated layers 19, which are provided on the both side faces of the core section 10, as well.

In the core substrate 58 of the present embodiment, the inner faces of the pilot holes 18 formed in the core section 10 are doubly coated with the plated layers 19 and the insulating films 21, and the insulating films 21 are exposed on the inner faces of the pilot holes 18. Therefore, even if voids are formed in the resin 20 and the voids make expanded parts 52b in the plated through-hole section 52 when the pilot holes 18 are filled with the resin 20, the insulating film 21 exists between the expanded parts 52b and the plated layer 19 so that short circuit between the plated through-hole sections 52 and the core section 10 can be prevented.

(Steps of Producing Another Core Substrate)

In the above described method of producing the core substrate 58, as shown in FIGS. 2A, 2B and 4A-4C, the gas purging holes 140 are formed on the both side faces of the substrate 16, and the cable layers 48 are laminated on the both side faces of the substrate 16 after filling the pilot holes 18 with the insulating resin 20. In some cases, the gas purging holes 140 are used in only the step of filling the pilot holes 18 with the resin 20, and the copper foils 14 and the plated layers 19, in which the gas purging holes 140 are formed, are removed in the following step. If the copper foils 14 and the plated layers 19 broadly coat the surfaces of the substrate 16 when insulating layers are formed thereon, adhesiveness between the insulating layers and the substrate 16 will be worsened.

Figure 8A:
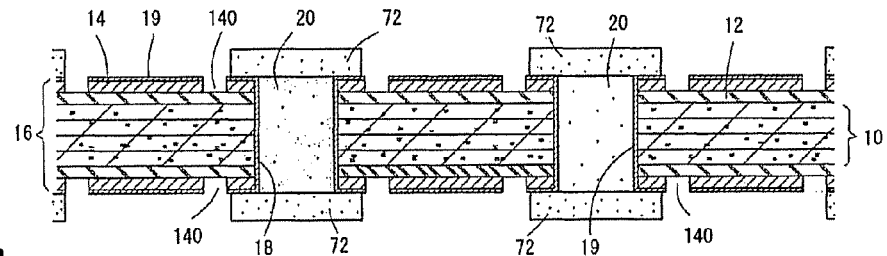
FIGS. 8A-8C are partial sectional views showing the steps of producing the modified core substrate.
Figure 8B:
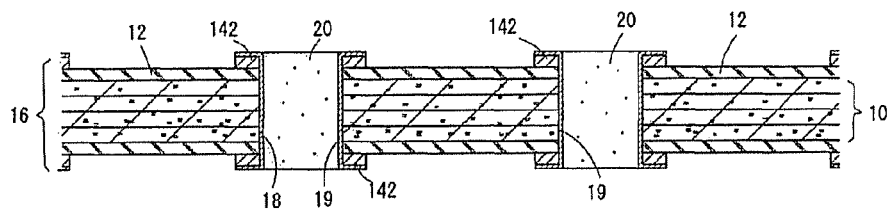
Figure 8C:
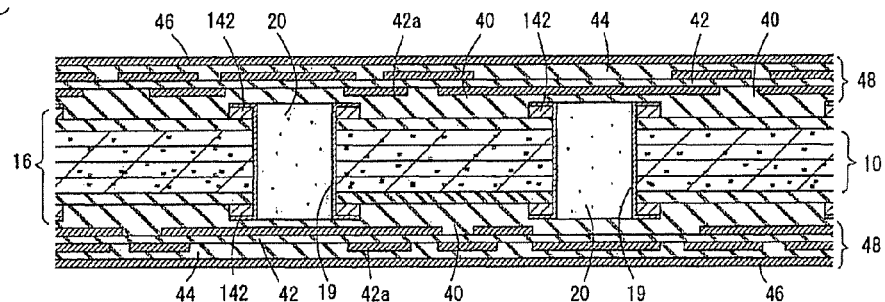

In the method shown in FIGS. 8A-8C, the pilot holes 18 are filled with the resin 20, the gas purging holes 140 are removed, and then further steps for completing the core substrate is performed.

In FIG. 8A, the pilot holes 18 are filled with the resin 20, photo resist is applied on the both side faces of the substrate 16, and then resist patterns 72 are formed by optically exposing and developing the photo resist. The resist patterns 72, which have a prescribed width, coat the edges of the pilot holes 18.

In FIG. 8B, the copper foils 14 and the plated layers 19, which are exposed on the surfaces of the substrate 16, are removed by an etching method, in which the resist patterns 72 are used as masks. Therefore, ring-shaped lands 142 are formed or left along the edges of the pilot holes 18.

When the resist patterns 72 are patterned, a width of the resist to be left along the edges of the pilot holes 18 are designed with considering amounts of etching side faces of the copper foils 14 and the plated layers 19, as well as the step of forming the gas purging holes 140 on the both side faces of the substrate 16.

In FIG. 8C, the cable layers 48 are integrally laminated on the both side faces of the substrate 16 by the above described steps.

The cable layers 48 are formed by laminating the prepregs 40, the cable sheets 42, the prepregs 44 and the copper foils 46 in this order and heating and pressurizing the laminated members as well as the steps shown in FIGS. 5A-5C, so that they can be integrally bonded on the substrate 16. Since only the lands 142, which are respectively formed along the edges of the pilot holes 18, are formed on the surfaces of the substrate 16, paths for discharging the gas and water vapor generated from the core section 10 and the substrate 16 can be securely formed.

Figure 9:
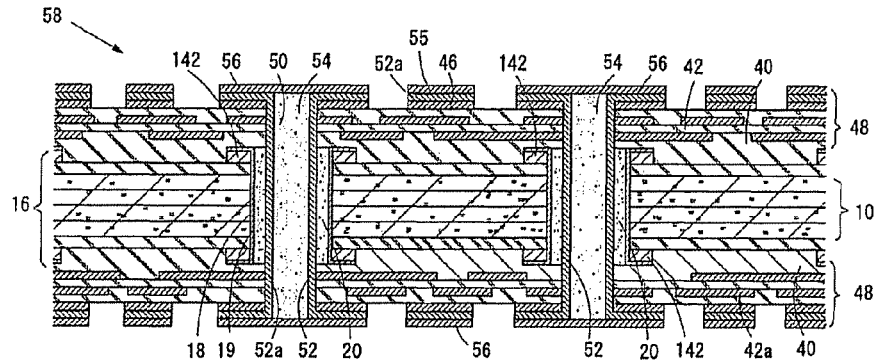
FIG. 9 is a partial sectional view of another modified core substrate.

FIG. 9 shows the completed core substrate 58, which is produced by forming the cable layers 48 on the both side faces of the substrate 16 and forming the plated through-hole sections 52 penetrating the pilot holes 18. The thorough-holes 50 are bored in the thickness direction and coaxial with the pilot holes 18, the plated layers 52a are formed on the inner faces of the through-holes 50 by the electroless copper plating and the electrolytic copper plating, the through-holes 50 are filled with the resin 54, and then the plated layers 55, which are constituted by the copper foils 46, the plated layers 52a and the cap-plated layers, are etched in prescribed patterns so as to form the cable patterns 56.

The cable patterns 56 formed on the both side faces of the core substrate 58 can be mutually electrically connected by the plated through-hole sections 52. Further, ring-shaped lands 142 are formed along the edges of the pilot holes 18 formed in the core section 10.

(Steps of Producing Circuit Board)

The circuit board can be produced by laminating the cable patterns on the both side faces of the core substrate 58.

Figure 10:
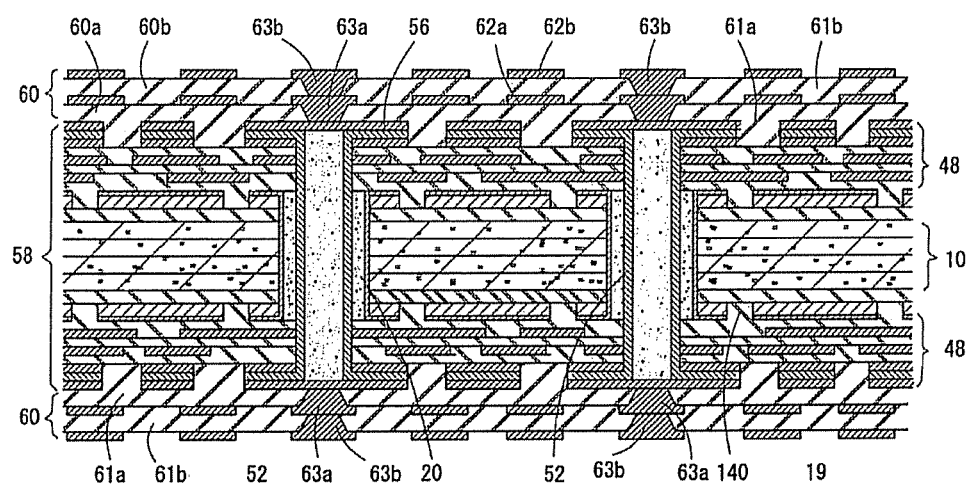
FIG. 10 is a partial sectional view of a circuit board.

In the circuit board shown in FIG. 10, build-up layers 60, each of which is constituted by two build-up layers 60a and 60b, are formed on the both side faces of the substrate 16, in which the gas purging holes 140 are formed in the both side faces.

Each of the first build-up layers 60a includes: an insulating layer 61a; a cable pattern 62a formed on a surface of the insulating layer 61a; and vias 63a electrically connecting the lower cable pattern 56 to the upper cable pattern 62a. Each of second build-up layers 60b includes: an insulating layer 61b; a cable pattern 62b; and vias 63b.

The cable patterns 62a and 62b, which are included in the build-up layers 60 formed on the both side faces of the core substrate 58, are mutually electrically connected by the plated through-hole sections 52 and the vias 63a and 63b.

The steps of forming the build-up layers 60 will be explained.

Firstly, insulating layers 61a are formed on the both side faces of the core substrate 58 by laminating insulating resin films, e.g., epoxy film, and via holes, in which the vias 63a will be formed and in which the cable patterns 56 formed on the side faces of the core substrate 58 are exposed, are bored in the insulating layers 61a by laser means.

Next, the inner faces of the via holes are desmear-treated so as to roughen the inner faces thereof, and then the inner faces of the via holes and the surfaces of the insulating layers 61a are coated with copper layers by the electroless plating.

Then, the electroless-plated copper layers are coated with photoresist, and resist patterns, in which parts of the electroless-plated copper layers which will be formed as the cable patterns 62a are exposed, are formed by optically exposing and developing the photoresist.

Further, the electrolytic plating, in which the resist patterns are used as masks and in which the electroless-plated copper layers are used as electric power feeding layers, is performed so as to supply copper to the exposed parts of the electroless-plated copper layers for upraising the copper therein. In this step, the via holes are filled with copper supplied by the electrolytic plating method and the vias 63a are formed.

Next, the resist patterns are removed, and the exposed parts of the electroless-plated copper layers are etched and removed, so that cable patterns 62a are formed, in prescribed patterns, on the surfaces of the insulating layers 61a.

The second build-up layers 60b can be formed as well as the first build-up layers 60a.

Electrodes, to which semiconductor elements will be connected, or connecting pads, to which external connectors will be connected, are patterned in the outermost layers, and the outermost layers other than the exposed parts, e.g., electrodes, connecting pads, are coated with protection films. The exposed electrodes or connecting pads are plated with, for example, gold for protection. The circuit board may be produced by other methods. The steps of forming the cable layers on the both side faces of the core substrate 58 are not limited to the above described steps.

In the above described embodiments, the core substrate has the core section 10 composed of electrically conductive carbon fiber-reinforced plastic. The present invention may be applied to core substrates having core sections composed of other electrically conductive materials. Further, the present invention can be applied to general methods of producing circuit boards. Namely, the gasses and water vapor generated from the substrate can be securely discharged, so that the problem caused by them can be effectively solved.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A core substrate, comprising:
   an electrically conductive core section having a pilot hole, through which a plated through-hole section is formed;
   electrically conductive layers coating the inner face of the pilot hole and a surface of the core section;
   a gas purging hole being formed in the conductive layer coating the surface of the core section;
   an insulating material filling a space between the inner face of the pilot hole and an outer circumferential face of the plated through-hole section; and
   cable layers being laminated on both side faces of the core section.

2. The core substrate according to claim 1,
   wherein copper foils are bonded on the both side faces of the core section with insulating layers,
   the pilot hole is formed to penetrate into the substrate on which the copper foils have been bonded,
   the conductive layers coat the inner face of the pilot hole and the copper foils coating the surfaces of the substrate, and
   the gas purging hole is formed in the copper foil on the surfaces of the substrate and the conductive layer.

3. The core substrate according to claim 1,
   further comprising an insulating film being formed on the conductive layer coating the inner face of the pilot hole.

4. The core substrate according to claim 1,
   wherein the gas purging hole is located near an edge of the pilot hole.

5. The core substrate according to claim 1,
   wherein the core section is composed of carbon fiber-reinforced plastic and formed into a flat plate by heating and pressurizing a plurality of prepregs including carbon fibers.

6. A method of producing a core substrate,
   comprising the steps of:
   forming a pilot hole in a substrate having an electrically conductive core section; so as to form a plated layer coating an inner face of the pilot hole and a surface of the substrate;
   forming a gas purging hole by etching an electrically conductive layer, which is formed on the plated layer coating the surface of the substrate; and
   filling the pilot hole of the substrate, in which the gas purging hole has been formed, with an insulating material.

7. The method according to claim 6,
wherein an insulating film is formed on the plated layer by an electrodeposition method, in which the plated layer is used as an electric power feeding layer, after forming the plated layer, which coats the inner face of the pilot hole and the surface of the substrate.

8. The method according to claim 6,
wherein the conductive layers, which are formed on the surface of the substrate, is formed in a prescribed pattern after filling the pilot hole with resin.

9. The method according to claim 6,
wherein cable layers are integrally formed on the both side faces of the substrate after filling the pilot hole with resin, and
a plated through-hole section is formed, after forming the cable layers, by forming a through-hole in the pilot hole of the substrate and forming a plated layer on an inner face of the through-hole.

10. A method of producing a circuit board, comprising the steps of:

forming a pilot hole in a substrate having an electrically conductive core section; so as to form a plated layer coating an inner face of the pilot hole and a surface of the substrate;

forming a gas purging hole by etching an electrically conductive layer, which is formed on the plated layer coating the surface of the substrate;

filling the pilot hole of the substrate, in which the gas purging hole has been formed, with an insulating material; and laminating cable layers on the substrate.

* * * * *